(12) United States Patent
Sakakura et al.

(10) Patent No.: US 6,929,986 B2
(45) Date of Patent: Aug. 16, 2005

(54) SEMICONDUCTOR DEVICE, DISPLAY DEVICE, AND METHOD OF MANUFACTURING THE SAME

(75) Inventors: Masayuki Sakakura, Kanagawa (JP); Satoshi Murakami, Kanagawa (JP); Hirokazu Yamagata, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/730,986

(22) Filed: Dec. 10, 2003

(65) Prior Publication Data

US 2004/0113150 A1 Jun. 17, 2004

Related U.S. Application Data

(62) Division of application No. 10/199,506, filed on Jul. 22, 2002, now Pat. No. 6,686,605.

(30) Foreign Application Priority Data

Jul. 27, 2001 (JP) .......................................... 2001-228164

(51) Int. Cl.⁷ .......................... H01L 21/00; H01L 21/84
(52) U.S. Cl. ....................... 438/149; 438/151; 438/157; 438/283
(58) Field of Search ....................... 257/59, 72; 438/48, 438/128, 149, 151, 157, 283

(56) References Cited

U.S. PATENT DOCUMENTS

| 5,644,370 A | 7/1997 | Miyawaki et al. |
| 5,742,363 A * | 4/1998 | Bae .............................. 349/38 |
| 6,411,346 B1 | 6/2002 | Numano et al. |
| 2002/0068388 A1 | 6/2002 | Murakami et al. |

FOREIGN PATENT DOCUMENTS

| EP | 0 554 060 | 8/1993 |
| JP | 05-210116 | 8/1993 |
| JP | 06-230425 | 8/1994 |
| JP | 8-96959 | 4/1996 |
| JP | 9-63770 | 3/1997 |
| JP | 11-038439 | 2/1999 |
| JP | 11-038440 | 2/1999 |
| JP | 2000-002889 | 1/2000 |

OTHER PUBLICATIONS

Office Action (Application No. 2002–219269) with partial English Translation, Jul. 20, 2004, 4 pages.

* cited by examiner

Primary Examiner—Thien F Tran
(74) Attorney, Agent, or Firm—Fish & Richardson P.C.

(57) ABSTRACT

In order to eliminate the disconnection of a pixel electrode caused by a change in shape of an interlayer insulating film at the ends of metal wiring, a resin film is formed at the ends of the metal wiring. Because of the resin film at the ends of the metal wiring, the step difference of the ends of the metal wiring is alleviated, and even if the interlayer insulating film is changed in shape, the ends of the metal wiring is prevented from peeling, whereby the disconnection of the pixel electrode can be prevented. Furthermore, the resin film flattens the surface of the interlayer insulating film, and prevents an alignment defect of liquid crystal molecules and a non-uniform electric field, thereby suppressing a minute defect of a light-emitting device caused by the roughness of the surface of the pixel electrode.

24 Claims, 14 Drawing Sheets

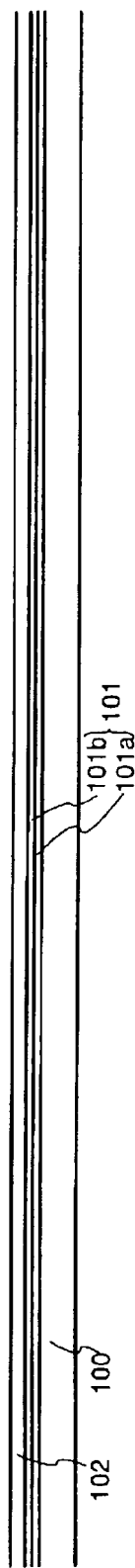
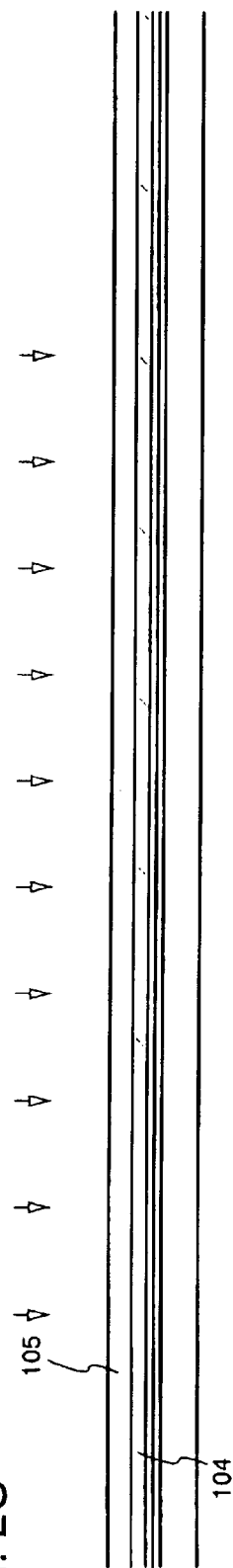

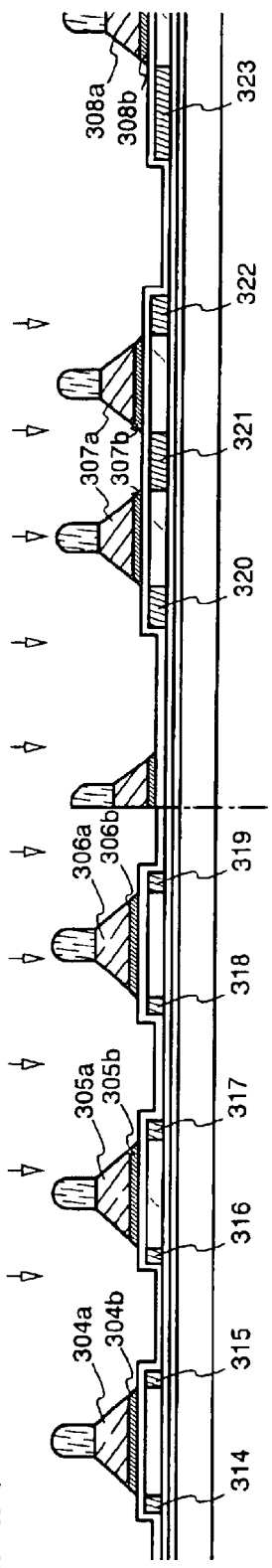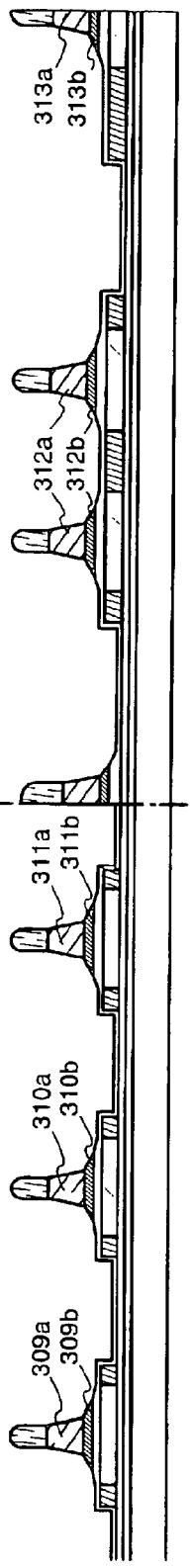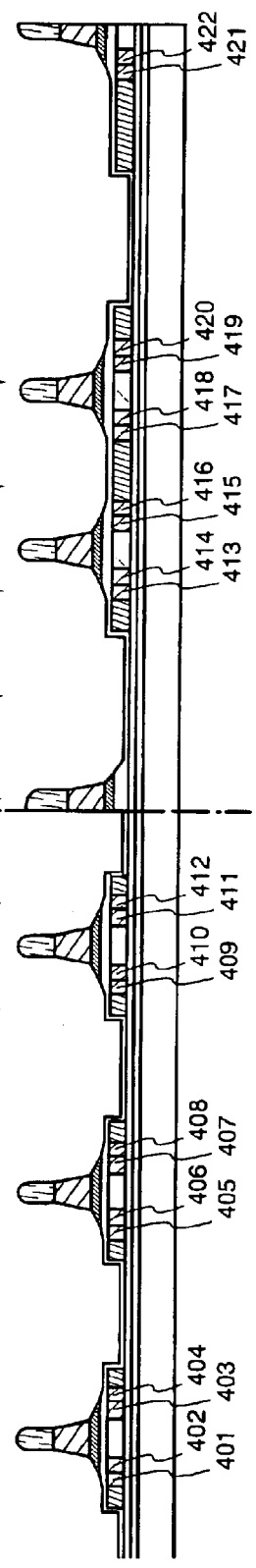
FIG. 4A
FIG. 4B
FIG. 4C

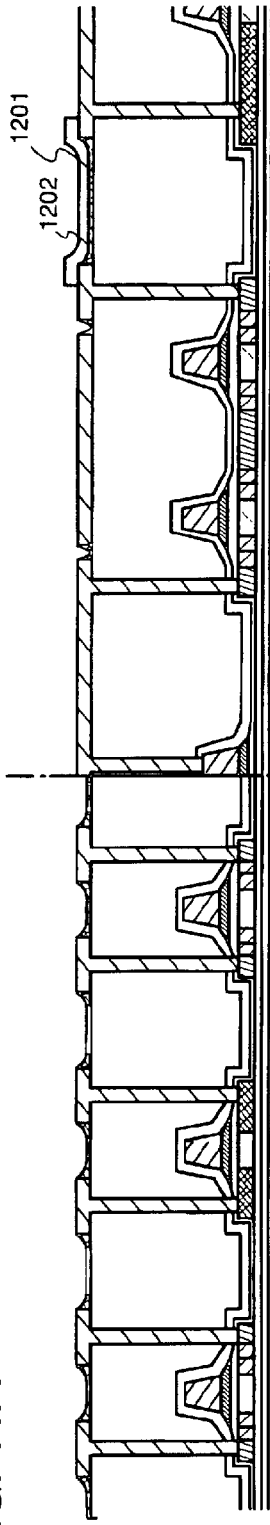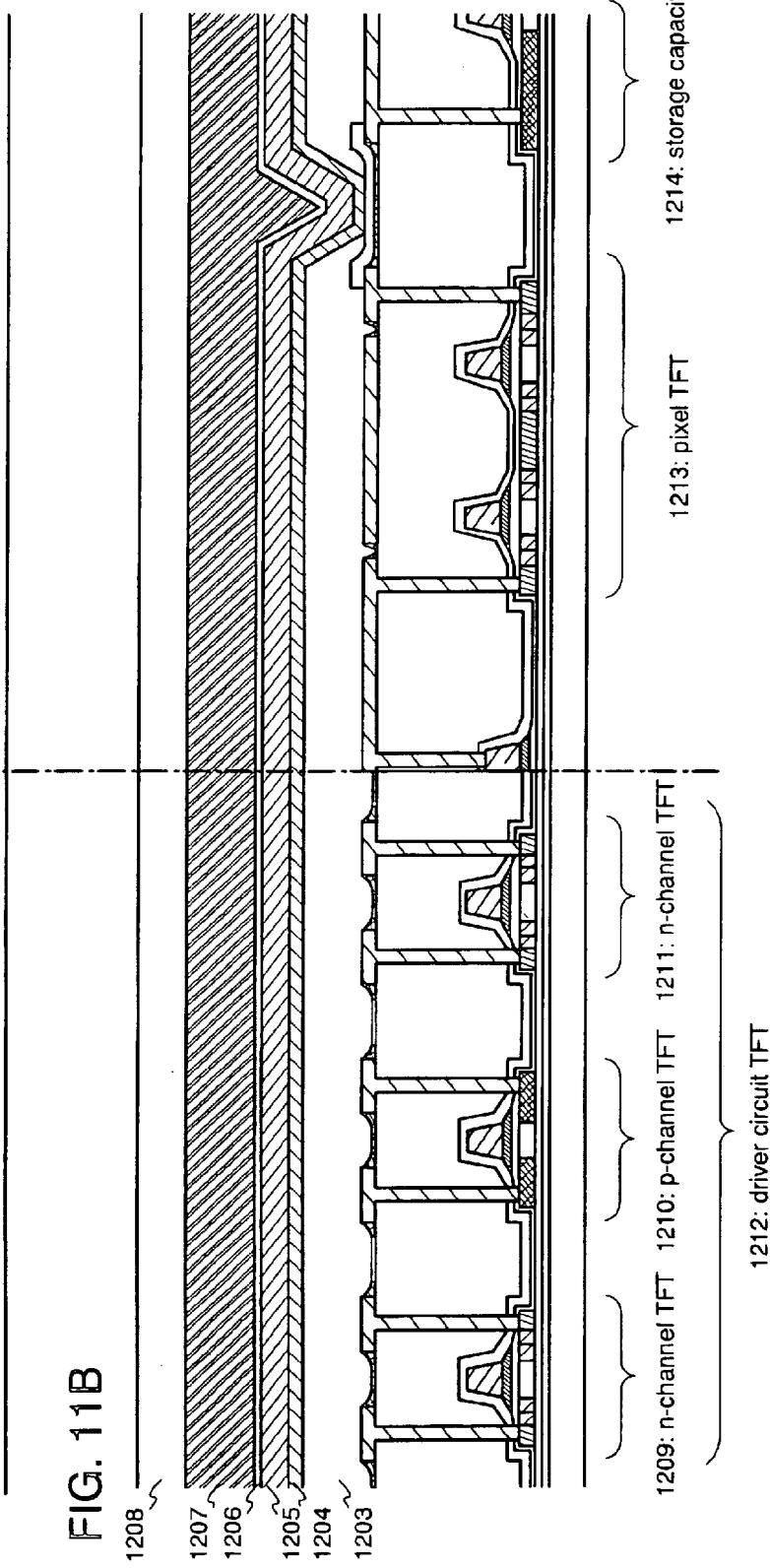
FIG. 11A
FIG. 11B

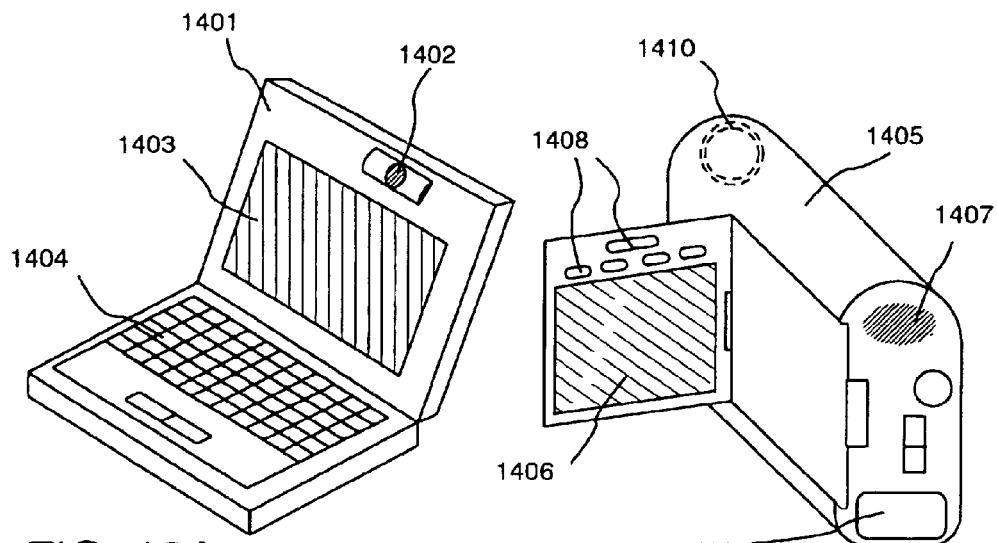
FIG. 13A
FIG. 13B
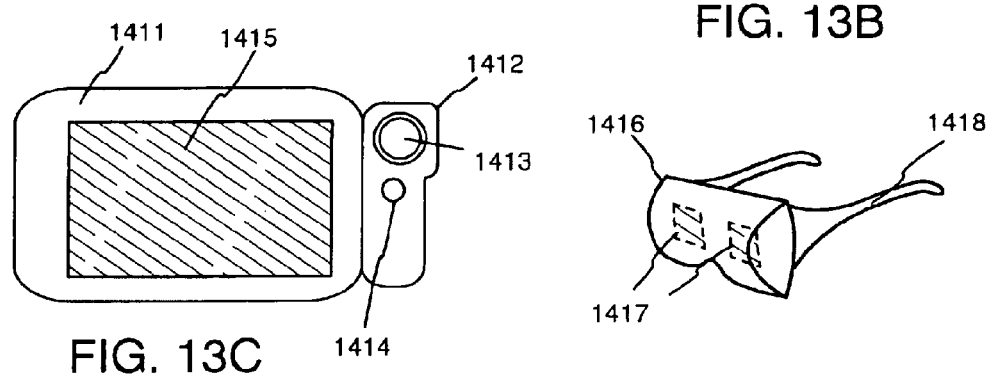
FIG. 13C
FIG. 13D
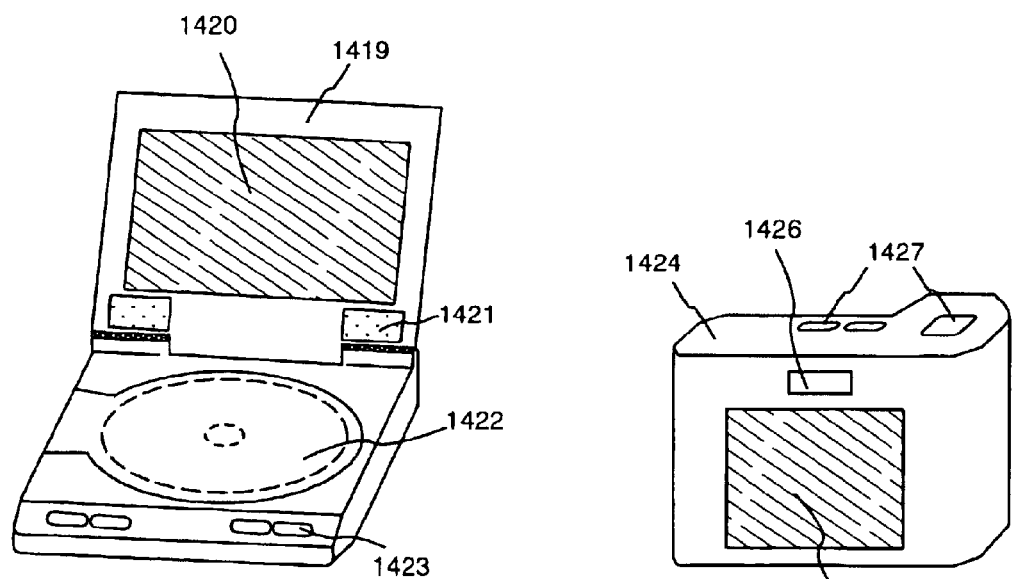
FIG. 13E
FIG. 13F

SEMICONDUCTOR DEVICE, DISPLAY DEVICE, AND METHOD OF MANUFACTURING THE SAME

CROSS-REFERENCE TO RELATED APPLICATION

This application is a divisional application of U.S. application Ser. No. 10/199,506, filed on Jul. 22, 2002 now U.S. Pat. No. 6,686,605, which claims the benefit of a foreign priority application filed in Japan on Jul. 27, 2001 as Ser. No. 2001-228164. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a semiconductor device having a circuit composed of thin film transistors (hereinafter referred to as TFTs), a display device such as a light emitting device and a liquid crystal display device, and a manufacturing method of the same. Specifically, the present invention relates to the technique of pixel electrode periphery portion structures.

2. Description of the Related Art

A technique for manufacturing a TFT from a semiconductor thin film (with a thickness of between several hundreds to several thousands of nm) formed on a substrate having an insulating surface has recently been developed. In particular, since a TFT in which a polysilicon film (polycrystalline silicon film) is an active layer (hereinafter referred to as polysilicon TFT) has high electric field effect mobility, the thin film transistor is widely applied to semiconductor devices such as integrated circuits (hereinafter referred to as ICs) or electro-optical devices, and is needed to be developed promptly as, in particular, a switching element for a display device or the like.

For example, in a semiconductor device, a pixel portion for performing image displays on respective functional blocks, and an integrated circuit for controlling the pixel portion, (such as a shift register circuit, a level shifter circuit, a buffer circuit, or a sampling circuit which are based on a CMOS circuit) are formed on a single substrate.

Further, active-matrix liquid crystal display devices are frequently used as semiconductor devices because images with higher definition can be obtained compared to passive liquid crystal display devices. Also, the active-matrix liquid crystal display device includes: a gate wiring; a source wiring; a TFT in a pixel portion, which is provided at the cross point of the gate wiring and the source wiring; and a pixel electrode connected to the TFT in the pixel portion.

FIG. 8 is a cross section diagram of the pixel portion of a conventional semiconductor device. As in FIG. 8 in a conventional semiconductor device, a pixel electrode 804 was directly connected to a metal wiring 802 connecting a pixel TFT 805 and a metal wiring 803 connecting a storage capacitor 806.

However, an interlayer insulating film 801 contracts due to heat, and expands by containing water. Therefore, the following is confirmed: the wiring 802, 803 is likely to peel off the interlayer insulating film 801 to cause a shape defect of the wiring 802, 803; and the pixel electrode 804 is disconnected at a step portion of the wiring 802, 803.

FIG. 10 shows the above-mentioned defect of a wiring shape. FIG. 10 shows an image obtained by an SIM (Scanning Ion Microscope) with a magnification of 27,500 times. A wiring (Ti/Al/Ti) and a pixel electrode (made of an indium oxide—tin oxide ($In_2O_3$—$SnO_2$) alloy (ITO)) are connected to the surface of an interlayer insulating film (made of acrylic resin). However, the wiring (Ti/Al/Ti) peels off the surface of the interlayer insulating film (acrylic resin). Along with this, the pixel electrode connected to the wiring (Ti/Al/Ti) is disconnected at the ends of the wiring (Ti/Al/Ti).

Disconnection of the pixel electrode at the ends of the wiring (Ti/Al/Ti) is one of the causes for a point defect of a semiconductor device.

There is also another problem. Due to the roughness of the upper surface of the interlayer insulating film, the pixel electrode on the interlayer insulating film is roughened to cause an alignment defect of liquid crystal molecules and a non-uniform electric field.

Furthermore, due to the roughness of the upper surface of the interlayer insulating film, the pixel electrode on the interlayer insulating film is roughened to cause a defect of the light-emitting device in which a minute defect occurs in the light-emitting layer laminated on the pixel electrode.

SUMMARY OF THE INVENTION

Therefore, with the foregoing in mind, it is an object of the present invention to provide a configuration for eliminating disconnection of pixel electrodes caused by a change in shape of an interlayer insulating film at the ends of metal wiring and a method of manufacturing the same; and to enhance productivity, yield and reliability.

It is another object of the present invention to provide a configuration for preventing an alignment defect of liquid crystal molecules and a non-uniform electric field caused by the roughness of the upper surface of an interlayer insulating film, and to enhance productivity, yield and reliability.

It is still another object of the present invention to provide a configuration for preventing a defect of a light-emitting device in which a minute defect occurs in a light-emitting layer due to the roughness of a pixel electrode caused by the roughness of the upper surface of an interlayer insulating film and a method of manufacturing the same, and to enhance productivity, yield, and reliability.

According to the present invention, by using an insulating film (typically a resin film), the processes of formation of a semiconductor layer to formation of a pixel electrode are conducted with 6 photomasks without increasing the number thereof, and disconnection of the pixel electrode is eliminated, whereby productivity, yield and reliability are enhanced.

Six photomasks include the following: a first photomask for forming a semiconductor layer; a second photomask for forming a gate electrode; a third photomask for forming a semiconductor layer containing an impurity element of one conductivity (n-type or p-type); a fourth photomask for forming a contact hole; a fifth photomask for forming metal wiring; and a sixth photomask for forming a pixel electrode.

Furthermore, according to the present invention, an insulating film (typically resin film) is formed on an interlayer insulating film so as to alleviate the step difference of ends of metal wiring. More specifically, an angle of the step difference of the ends of the metal wiring at which a pixel electrode extends is made gentle.

The resin film is formed so as to alleviate the step difference of the ends of the metal wiring, so that the pixel electrode can be prevented from peeling off a portion with the step difference. Thus, productivity, yield, and reliability can be enhanced.

Furthermore, the resin film flattens the roughness of the upper surface of the interlayer insulating film.

The resin film flattens the roughness of the surface of the interlayer insulating film. Therefore, an alignment defect of liquid crystal molecules and a non-uniform electric field, caused by the roughness of the upper surface of the interlayer insulating film, can be prevented, which enhances the productivity, yield, and reliability of a semiconductor device.

Furthermore, the resin film flattens the roughness of the upper surface of the interlayer insulating film. Therefore, a defect of a light-emitting device, in which a minute defect of a light-emitting layer occurs due to the roughness of a pixel electrode caused by the roughness of the upper surface of the interlayer insulating film, can be prevented. This enhances the productivity, yield, and reliability of a light-emitting device.

These and other advantages of the present invention will become apparent to those skilled in the art upon reading and understanding the following detailed description with reference to the accompanying figures.

BRIEF DESCRIPTION OF THE DRAWINGS

In the accompanying drawings:

FIGS. 2A to 2C show processes of manufacturing the semiconductor display device;

FIGS. 4A to 4C show processes of manufacturing the semiconductor display device;

FIGS. 11A and 11B show processes of manufacturing a light-emitting device;

FIGS. 13A to 13F illustrate examples of devices utilizing the semiconductor display device;

DESCRIPTION OF THE PREFERRED EMBODIMENTS

[Embodiment Mode 1]

Figure 1:
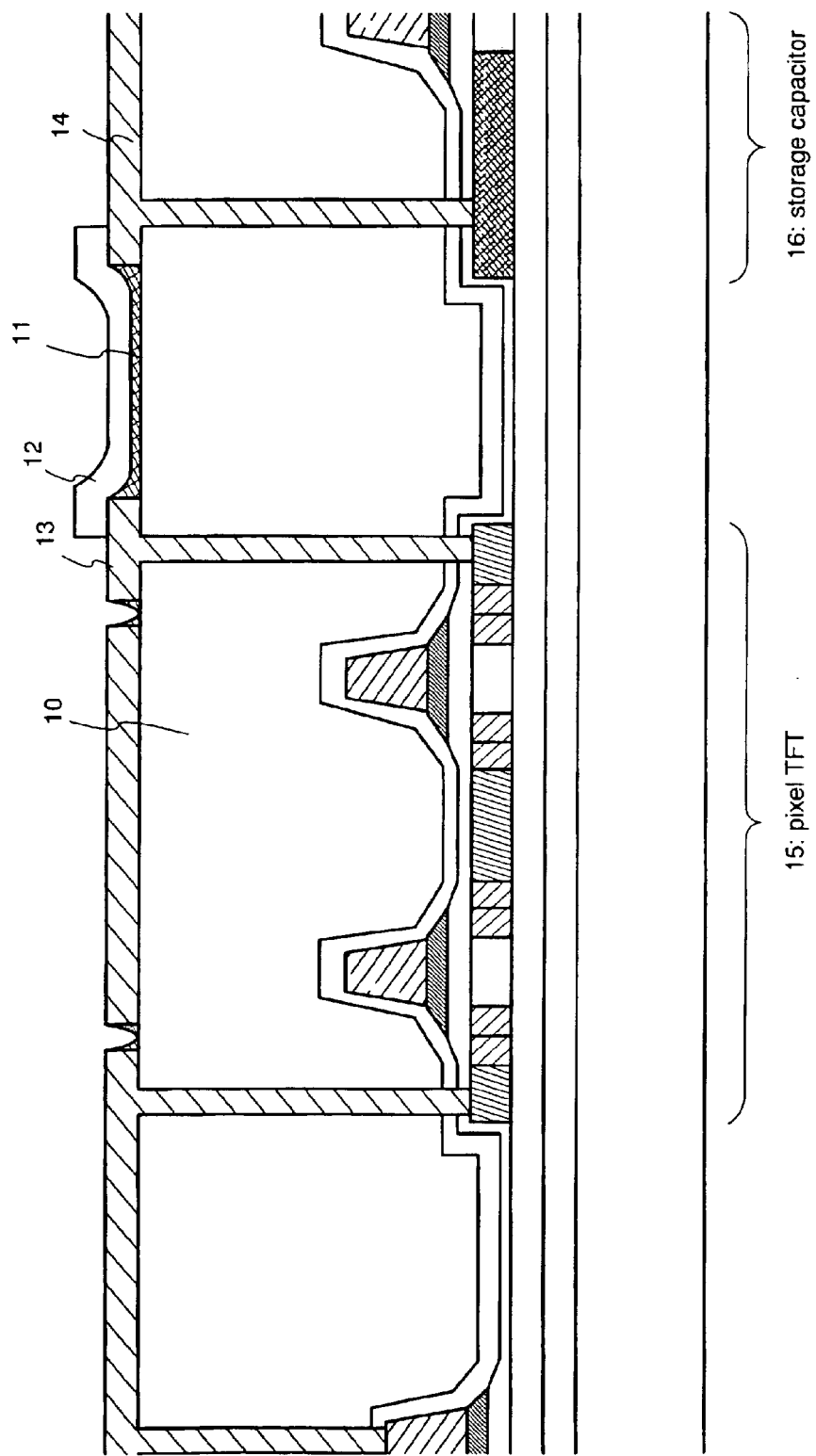
FIG. 1 is a cross-sectional view of a semiconductor display device in which the present invention is carried out.

FIG. 1 shows a semiconductor device of the present invention. According to the present invention, in order to eliminate the disconnection of a pixel electrode 12 caused by a change in shape of an interlayer insulating film 10 at the ends of metal wiring, an insulating film (typically a resin film) 11 is formed on the interlayer insulating film 10. Specifically, the insulating film 11 is formed in a side portion of the metal wiring 13 and 14, which is interposed between the entire surface or a partial surface of the interlayer insulating film 10 and the pixel electrode 12 and has a curved surface at a portion (sidewall portion of the metal wiring) in contact with the metal wiring 13, 14, whereby the step difference of the ends of the metal wiring 13, 14 is alleviated. Thus, even if the interlayer insulating film 10 is changed in shape, the ends of the metal wiring 13, 14 are prevented from peeling, whereby the disconnection of the pixel electrode 12 can be prevented.

Furthermore, because of the resin film 11, the roughness of the upper surface of the interlayer insulating film 10 can be flattened, which can flatten the surface of the pixel electrode 12. Therefore, an alignment defect of liquid crystal molecules and a non-uniform electric field can be prevented.

Herein, the insulating film (resin film in the present embodiment mode) 11 is made of a resin having a concentration lower than that of the interlayer insulating film 10 and having a decreased viscosity. Examples of the material for the resin film include polyimide, acrylic resin, polyamide, polyimideamide, BCB (benzocyclobutene), cyclobutene, and the like. Resin insulating films and organic SiO compounds other than those described above can also be used. An insulating film made of an inorganic material can also be used as long as the flatness is high.

Furthermore, the insulating film 11 may be made of a material different from that of the interlayer insulating film 10, and any combination of the above-mentioned materials may be used.

Figure 9:
FIG. 9 shows a wiring shape in which the present invention is carried out.
Figure 10:
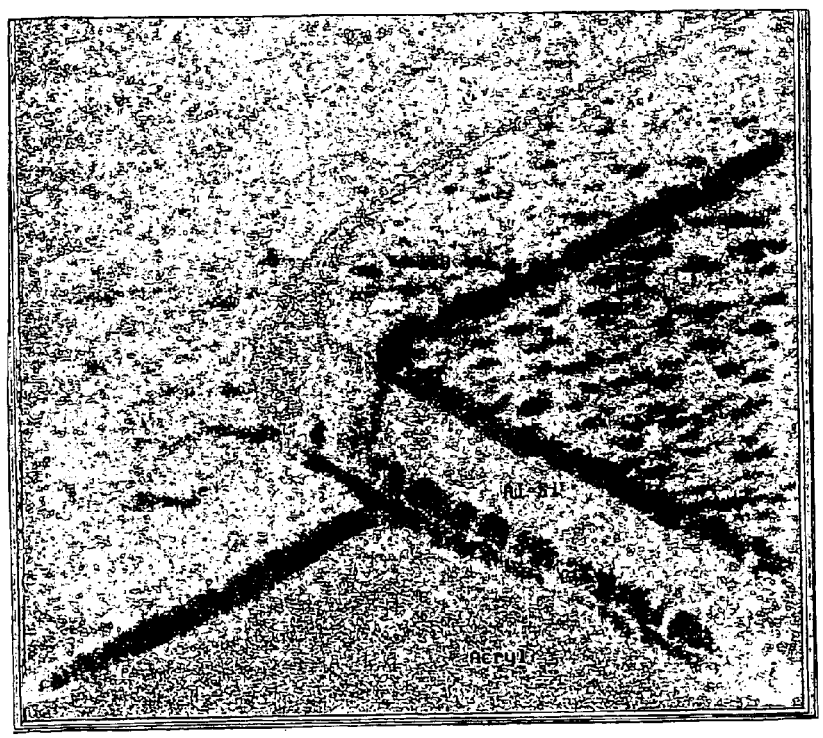
FIG. 10 shows a wiring defect in the conventional semiconductor device.

FIG. 9 shows a wiring shape in which the present invention is carried out. FIG. 9 is an image obtained by an SIM (Scanning Ion Microscope) with a magnification of 19,000 times. A wiring (Ti/Al/Ti) and a pixel electrode (made of an indium oxide—tin oxide ($In_2O_3$—$SnO_2$) alloy (ITO)) are connected to the surface of an interlayer insulating film (made of acrylic resin). According to the present invention, the wiring (Ti/Al/Ti) is connected to the surface of the interlayer insulating film (acrylic resin) without peeling off. Therefore, a pixel electrode connected to the wiring (Ti/Al/Ti) can be prevented from being disconnected at the ends of the wiring (Ti/Al/Ti).

Furthermore, the upper surface of the interlayer insulating film can be flattened according to the present invention. Therefore, the pixel electrode formed on the interlayer insulating film is also flattened, whereby an alignment defect of liquid crystal molecules and a non-uniform electric field can be prevented.

Furthermore, if the present invention is carried out in a light-emitting device, the upper surface of the interlayer insulating film can be flattened, and the pixel electrode formed on the interlayer insulating film can also be flattened. Therefore, a minute defect of the light-emitting device caused by the roughness of the upper surface of the pixel electrode can be suppressed, which contributes to the enhancement of yield.

[Embodiment Mode 2]

Embodiment Mode 2 will be described with reference to FIGS. 15A to 15D. In Embodiment Mode 2, the shape of an insulating film (typically a resin film) formed so as to alleviate the step difference between the interlayer insulating film and the ends of metal wiring, described in Embodiment Mode 1, will be described. In FIGS. 15A to 15D, description will be made by using the same reference numerals as those in FIG. 1 used for description in Embodiment Mode 1.

Figure 15D:
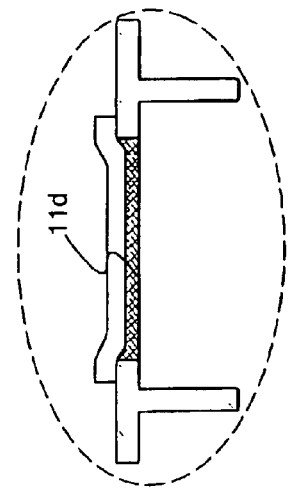
FIGS. 15A to 15D are cross-sectional views of the semiconductor display device in which the present invention is carried out.
Figure 15C:
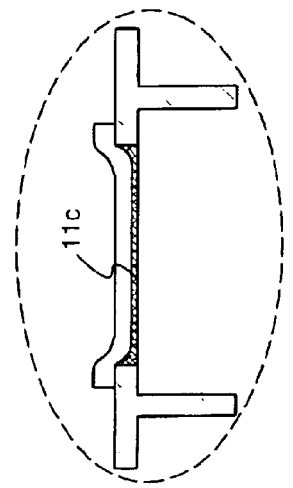
Figure 15B:
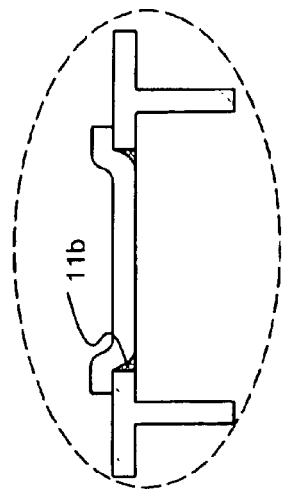
Figure 15A:
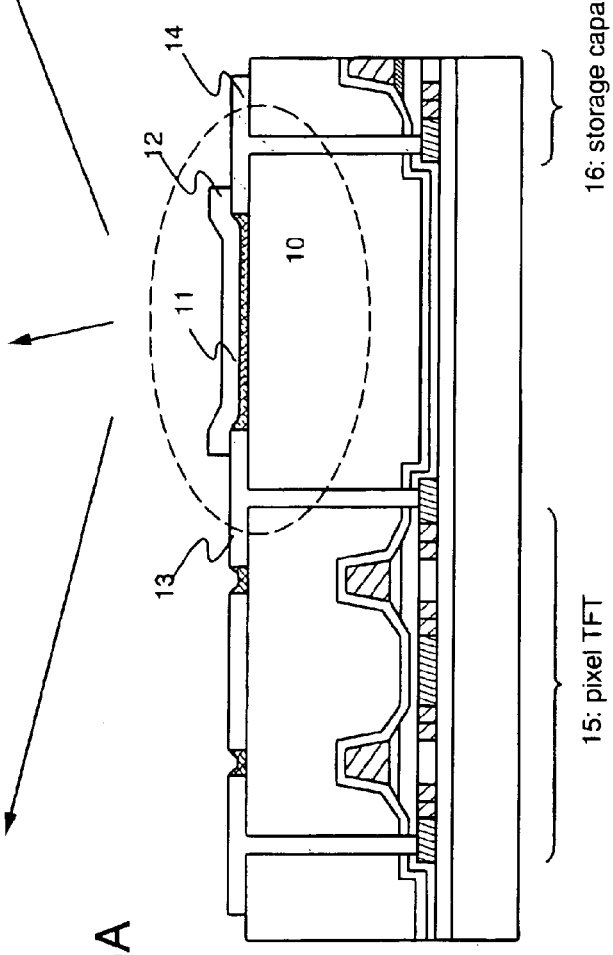

FIG. 15A is a view showing the semiconductor device in FIG. 1, and FIGS. 15B to 15D are enlarged views illustrating an interlayer insulating film 10, metal wiring 13, 14, insulating films 11b to 11d (resin films are used in the present embodiment) that alleviate the step difference between the metal wiring and the interlayer insulating film, and a pixel electrode 12.

In FIG. 15B, the resin film 11b covers the side surface of the metal wiring 13 or 14 and a part of the surface of the interlayer insulating film 10, and has a curved surface. More specifically, the resin film 11b is in contact with the side surface of the metal wiring 13 or 14, the interlayer insulating film 10, and the pixel electrode 12, and has a curved surface in a side surface region of the metal wiring. In the case of such a shape, the step difference between the metal wiring 13, 14 and the interlayer insulating film 10 is alleviated. Therefore, the disconnection of the pixel electrode can be prevented, which contributes to the enhancement of yield. Furthermore, since the interlayer insulating film 10 is in contact with the pixel electrode 12, there is no problem of interference fringes caused by the difference in material between the interlayer insulating film 10 and the resin film 11b, and the range of selection of each material is large.

In FIG. 15C, the resin film 11c covers a side surface region of the metal wiring 13, 14 and the surface of the interlayer insulating film 10, and has a curved surface. More specifically, the resin film 11C is in contact with the side surface region of the metal wiring 13, 14, the surface of the interlayer insulating film 10, and the pixel electrode 12 and has a curved surface in the side surface region of the pixel electrode 12. In the case of such a shape, since the step difference between the metal wiring 13, 14 and the interlayer insulating film 10 is alleviated, the disconnection of the pixel electrode 12 can be prevented, which contributes to the enhancement of yield. If the material of the interlayer insulating film 10 is different from that of the resin film 11d, interference fringes are formed to cause an irregular display. Therefore, in this case, it is desirable to minimize the thickness of the resin film to be formed on the surface of the interlayer insulating film.

In FIG. 15D, the resin film 11d has substantially the same thickness as that of the metal wiring 13, 14. More specifically, the resin film 11d is in contact with the side surface of the metal wiring 13, 14, the interlayer insulating film 10, and the pixel electrode 12, and has a curved surface in a side surface region of the pixel electrode 12 and substantially the same thickness as that of the metal wiring. In the case of such a shape, there is almost no step difference between the metal wiring 13, 14 and the interlayer insulating film 10. Therefore, the pixel electrode can be flattened, and a minute defect in a light-emitting device caused by the roughness of the upper surface of the pixel electrode can be suppressed, which contributes to the enhancement of yield. If the material of the interlayer insulating film 10 is different from that of the resin film 11d, interference fringes are formed to cause an irregular display. Therefore, it is desirable to use the same material.

Embodiments

[Embodiment 1]

A method of manufacturing a semiconductor device adopting the present invention will be described with reference to FIGS. 2A–7B and FIG. 12.

Figure 12:
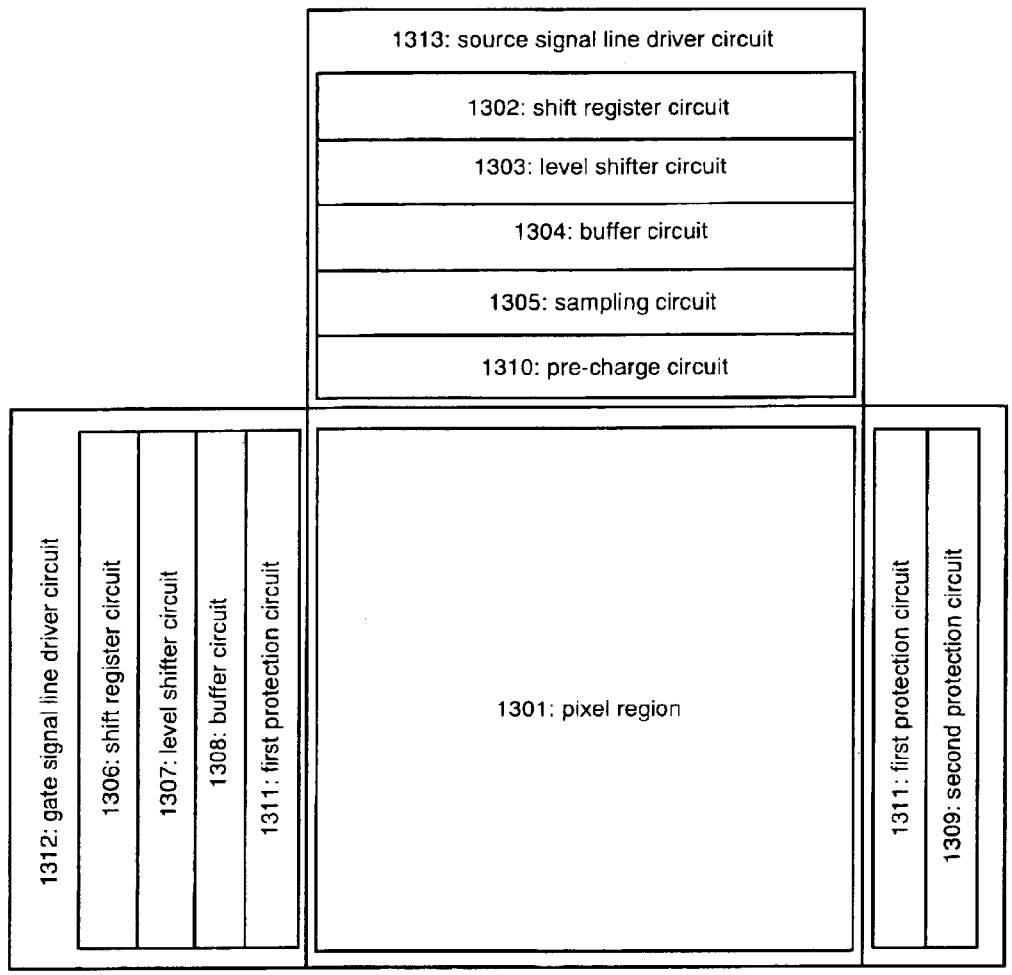
FIG. 12 is a circuit configuration of an entire semiconductor display device.

First, FIG. 12 shows a circuit configuration of the entire semiconductor device adopting the present invention. The semiconductor display device is composed of a pixel region 1301, a gate signal line driving circuit 1312, and a source signal line driving circuit 1313. The gate signal line driving circuit 1312 includes a shift register circuit 1306, a level shifter circuit 1307, a buffer circuit 1308, a first protection circuit 1311, and a second protection circuit 1309. The source signal line driving circuit 1313 includes a shift register circuit 1302, a level shifter circuit 1303, a buffer circuit 1304, a sampling circuit 1305, and a precharge circuit 1310.

A method of manufacturing a semiconductor device with the above-described circuit configuration will be described specifically with reference to FIGS. 2A–7B.

First, a semiconductor display device is manufactured by using a substrate 100 with transparency. Examples of the substrate to be used include glass substrates made of barium borosilicate glass, aluminoborosilicate glass, and the like, such as #7059 glass and #1737 glass produced by Corning Inc. In addition, transparent substrates such as a quartz glass substrate and a plastic substrate can also be used.

Then, a base film 101 made of an insulating film such as a silicon oxide film, a silicon nitride film, or a silicon oxynitride film is formed on the substrate 100. For example, a silicon oxynitride film formed of $SiH_4$, $NH_3$, and $N_2O$ by plasma CVD is formed to a thickness of 10 to 200 nm (preferably 50 to 100 nm). Furthermore, hydrogenated silicon oxynitride film formed of $SiN_4$ and $N_2O$ is laminated on the silicon oxynitride film to a thickness of 50 to 200 nm (preferably 10 to 150 nm). In the present embodiment, the base film 101 has a two-layer structure. However, the base film 101 may be a single-layer film of the insulating film or a layered film including at least two layers.

Then, an amorphous semiconductor film 102 is formed on the base film 101 to a thickness of 25 to 80 nm (preferably 30 to 60 nm). Thereafter, a crystalline semiconductor film 103 is formed by laser crystallization and known thermal crystallization. Although there is no particular limit to the material for the crystalline semiconductor film 103, it is preferable that the crystalline semiconductor film 103 may be formed of silicon or a silicon-germanium (SiGe) alloy.

In order to form the crystalline semiconductor film 103 by laser crystallization, an excimer laser of a pulse oscillation type or a continuous light-emitting type, a YAG laser, or a $YVO_4$ laser is used. In the case of using these lasers, laser light emitted from a laser oscillator is condensed in a line shape by an optical system so as to be irradiated to the semiconductor film. The condition for crystallization is as follows. In the case of using an excimer laser, a pulse oscillation frequency is set at several 30 Hz, and a laser energy density is set at 100 to 400 mJ/cm$^2$ (typically 200 to 300 mJ/cm$^2$). Furthermore, in the case of using a YAG laser, the second harmonic thereof is used to set a pulse oscillation frequency at several 1 to 10 kHz, and a laser energy density is set at 300 to 600 mJ/cm$^2$ (typically 350 to 500 mJ/cm$^2$). Laser light condensed in a line shape with a width of 100 to 1000 $\mu$m (e.g., 400 $\mu$m) is irradiated over the entire surface of the substrate with an overlap ratio of the line-shaped laser light being 80 to 98%.

After a silicon oxide film 105 is formed on the crystalline semiconductor film 103, doping of an impurity element (boron or phosphorus) is conducted so as to control the threshold value of TFTs. Doping is conducted at a typical dose amount of $5 \times 10^{13}$ atoms/cm$^2$ and an acceleration voltage of 30 kV.

Figure 3A:
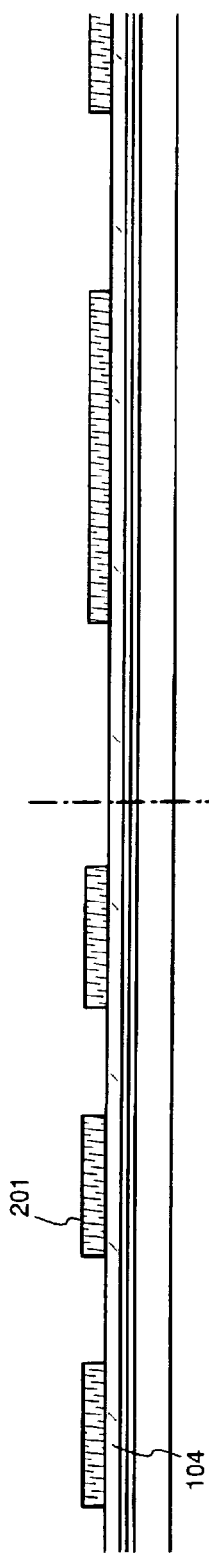
FIGS. 3A to 3C show processes of manufacturing the semiconductor display device.
Figure 3B:
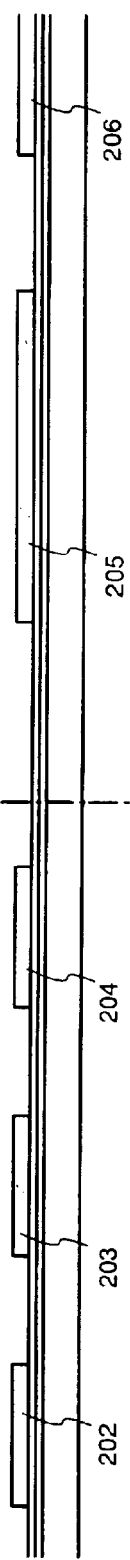
Figure 3C:
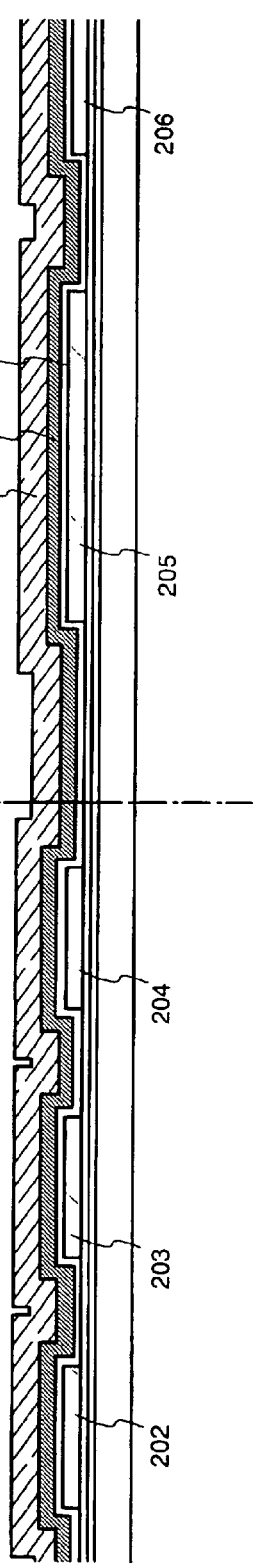

Next, as shown in FIGS. 3A to 3C, semiconductor layers 202 to 206 are formed using a resist 201 by first photolithography and etching.

Then, a gate insulating film 301 is formed so as to cover the semiconductor layers 202 to 206. The gate insulating film 301 is formed of an insulating film containing silicon to a thickness of 40 to 150 nm by plasma CVD or sputtering. In the present embodiment, a silicon oxynitride film with a thickness of 120 nm is formed. Needless to say, the gate insulating film is not limited to such a silicon oxynitride film, and a single-layer or multi-layer structure of an insulating film containing other silicon may be used. For example, in the case where a silicon oxide film is used, TEOS (tetraethyl orthosilicate) and $O_2$ are mixed by plasma CVD, and discharge is conducted at a reaction voltage of 40 Pa, a substrate temperature of 300° C. to 400° C., and a high-frequency (13.56 MHz) power density of 0.5 to 0.8 $W/cm^2$, whereby the gate insulating film can be formed. The silicon oxide film thus formed exhibits satisfactory characteristics as the gate insulating film by thermal annealing at 400° C. to 500° C.

Next, in order to form a gate electrode on the gate insulating film 301, a first conductive film 302 and a second conductive film 303 are formed. In the present embodiment, the first conductive film 302 is formed of TaN to a thickness of 50 to 100 nm, and the second conductive film 303 is formed of W to a thickness of 100 to 300 nm.

In the present embodiment, the first conductive film 302 is made of TaN, and the second conductive film 303 is made of W. However, these films may be formed of an element selected from the group consisting of Ta, W, Ti, Mo, Al and Cu, an alloy material mainly containing the element, or a compound material. Furthermore, a semiconductor film such as a polycrystalline silicon film doped with an impurity element such as phosphorus may be used. Examples of the combination other than that of the present embodiment include a combination of the first conductive film made of tantalum (Ta) and the second conductive film made of tungsten(W), a combination of the first conductive film made of tantalum nitride (TaN) and the second conductive film made of aluminum (Al), and a combination of the first conductive film made of tantalum nitride (TaN) and the second conductive film made of copper (Cu).

Next, a resist mask is formed by second photolithography, and gate electrodes and wirings 304 to 308 are formed by first etching. In the present embodiment, the gate electrodes and wirings are formed by ICP (Inductively Coupled Plasma) etching, in which etching gas is mixed and an RF power of 500 W is supplied to a coil-type electrode under a pressure of 1 Pa to generate plasma. An RF power of 100 W is also supplied to the substrate (sample stage) side to apply a substantially negative self-bias voltage thereto. By appropriately selecting etching gas, the W film and the TaN film are etched to the same degree.

Under the above-described etching condition, by making the shape of a resist mask appropriate, the angles of taper portions at the ends of the first conductive film and the second conductive film become 15° to 45° due to the effect of a bias voltage applied to the substrate side. In order to etch the first and second conductive films without leaving a residue on the gate insulating film 301, an etching time may be increased in a ratio of about 10 to 20%. Since the selection ratio of the silicon oxynitride film to the W film is 2 to 4 (typically 3), the surface of which the silicon oxynitride film is exposed is etched by about 20 to 50 nm by overetching. Thus, the gate electrodes and wirings made of the first conductive film and the second conductive film are formed by second photolithography.

Next, first doping is conducted, whereby an n-type impurity element is added. Doping is conducted by ion doping or ion implantation. Ion doping is conducted at a dose amount of $1\times10^{13}$ to $5\times10^{14}$ atoms/cm$^2$ and an acceleration voltage of 60 to 100 keV. As an n-type impurity element, an element belonging to Group 15 (typically phosphorus (P) or arsenic (As)) is used. Herein, phosphorus (P) is used. In this case, the conductive film functions as a mask with respect to the n-type impurity element, and first impurity regions 314 to 323 are formed in a self-alignment manner. The n-type impurity element is added to the first impurity regions 314 to 323 in a concentration of $1\times10^{20}$ to $1\times10^{21}$ atoms/cm$^3$.

Next, as shown in FIG. 4B, second etching is conducted. Reactive gas is introduced into a chamber, and a predetermined RF power is supplied to a coil-type electrode, whereby plasma is generated. A relatively low RF power is supplied to the substrate (sample stage) side, and an autobias voltage lower than that of the first etching is supplied. The W film is subjected to anisotropic etching to obtain conductive films 309 to 313 with a second shape.

Furthermore, as shown in FIG. 4C, second doping is conducted. In this case, doping of an n-type impurity element is conducted under the condition of a dose amount lower than that of the first doping and a higher acceleration voltage. For example, doping is conducted at a dose amount of $1\times10^{13}$ atoms/cm$^2$ and an acceleration voltage of 70 to 120 keV, whereby two kinds of impurity regions 401 to 422 are formed on an inner side of the first impurity regions 314 to 323 formed in the semiconductor layer in FIG. 4C. Doping is conducted using the conductive film with a second shape as a mask with respect to an impurity element in such a manner that the impurity element is also added to a region under the first conductive film. Thus, third impurity regions 402, 403, 406, 407, 410, 411, 414, 415, 418, 419, and 422 are formed so as to be overlapped with the first conductive film. The third impurity regions 402, 403, 406, 407, 410, 411, 414, 415, 418, 419, and 422 have an impurity concentration lower than that of the second impurity regions 401, 404, 405, 408, 409, 412, 413, 416, 417, 420, and 421, and the concentration of the n-type impurity element is set at $1\times10^{17}$ to $1\times10^{18}$ atoms/cm$^3$ in the third impurity regions.

Next, third photolithography is conducted. Fourth impurity regions 426, 427, and 428 with a conductivity opposite to one conductivity are formed in the semiconductor layers on which p-channel TFTs are to be formed. Using the conductive film with the second shape as a mask with respect to an impurity element, impurity regions are formed in a self-alignment manner. At this time, the semiconductor layers on which n-channel TFTs are to be formed are covered with resist masks 423, 424, and 425. In the impurity regions, phosphorus is added in respectively different concentrations. The impurity regions are doped with diborane ($B_2H_6$) by ion doping so that an impurity concentration becomes $2\times10^{20}$ to $2\times10^{21}$ atoms/cm$^3$.

As a result of the above-described processes, impurity regions are formed in each semiconductor layer. The conductive layers overlapped with the semiconductor layers function as gate electrodes of TFTs.

Figure 5A:
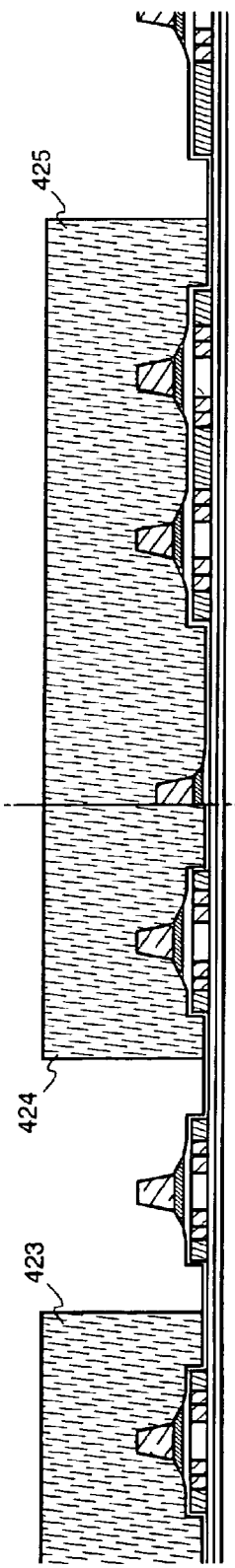
FIGS. 5A to 5C show processes of manufacturing the semiconductor display device.
Figure 5B:
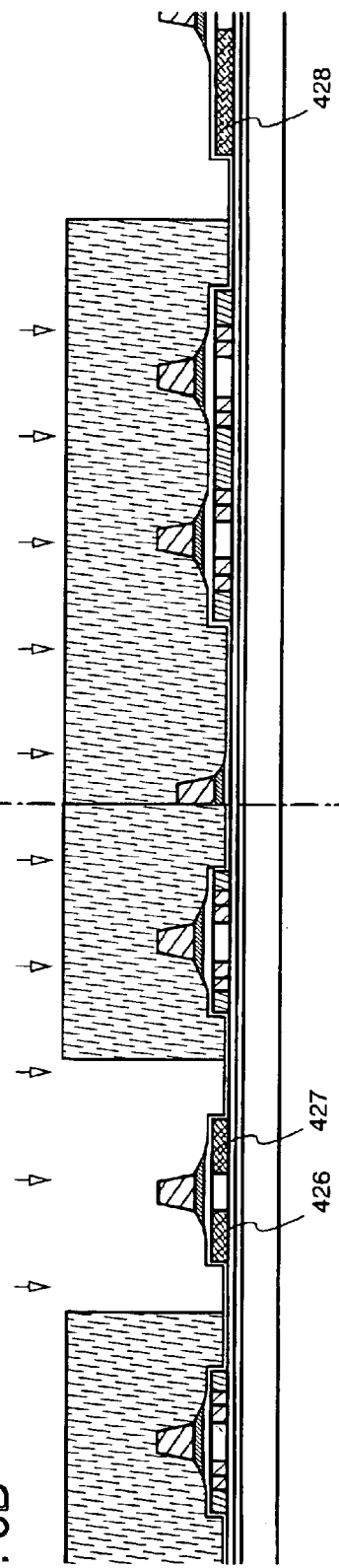
Figure 5C:
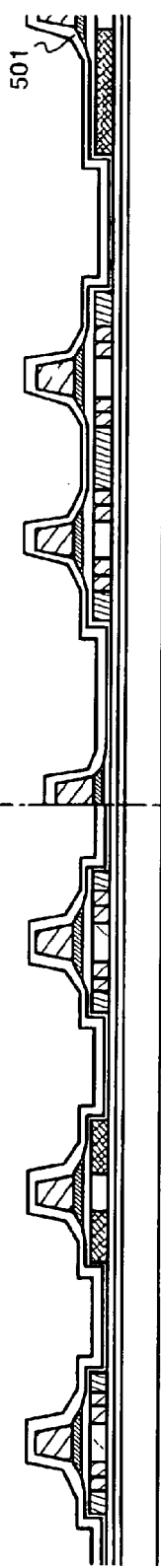

Then, as shown in FIG. 5C, the impurity elements added to each semiconductor layer are activated so as to control the conductivity. This process is conducted by thermal annealing using an annealing furnace. Alternatively, laser annealing or rapid thermal annealing (RTA) can be used. According to thermal annealing, the impurity elements are activated in a nitrogen atmosphere with a concentration of oxygen of 1 ppm or less, preferably 0.1 ppm or less at 400° C. to 700° C., typically 500° C. to 600° C. In the present embodiment, heat treatment is conducted at 500° C. for 4 hours. In the case where a wiring material is weak to heat, it is preferable that activation is conducted after an interlayer insulating film (mainly containing silicon) is formed so as to protect the wirings and the like.

As shown in FIG. 5C, the first interlayer insulating film 501 is formed of a silicon oxynitride film to a thickness of 100 to 200 nm. Furthermore, a second interlayer insulating film 502 made of an organic insulating material is formed on the first interlayer insulating film 501. Examples of the material for the second interlayer insulating film 502 include polyimide, acrylic resin, polyamide, polyimideamide, BCB, and the like. In the present embodiment, acrylic resin is used as a material for the second interlayer insulating film 502, and the thickness thereof is 1.6 $\mu$m.

Next, contact holes are formed by fourth photolithography. Contact holes are opened by dry etching. First, the second interlayer insulating film 502 is etched, and thereafter, the first interlayer insulating film 501 is etched.

Then, fifth photolithography is conducted. In a driving circuit portion, source wirings 503, 505, and 507 forming contact with source regions of the semiconductor layers and drain wirings 504, 506, and 508 forming contact with drain regions are formed. In a pixel portion, a source wiring 509 and a drain electrode 511 are formed. In the present embodiment, as metal wiring, Ti/Al/Ti is used.

Figure 6A:
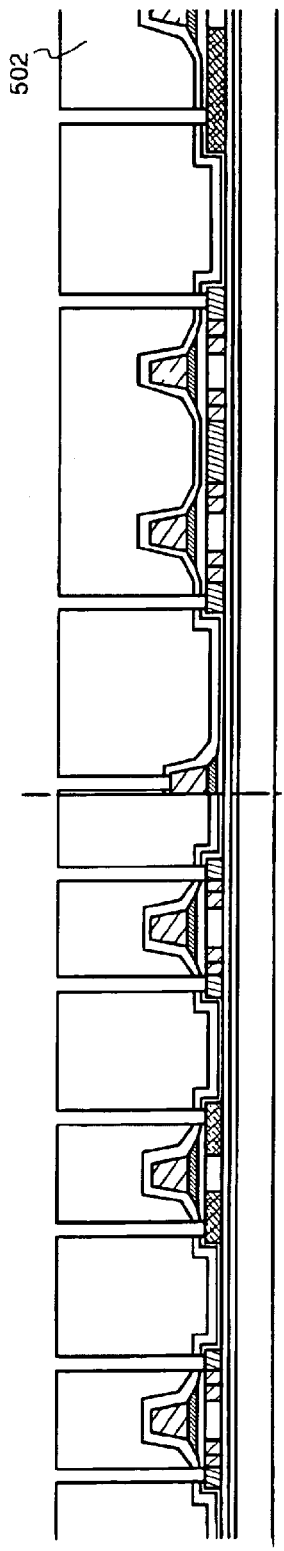
FIGS. 6A to 6C show processes of manufacturing the semiconductor display device.
Figure 6B:
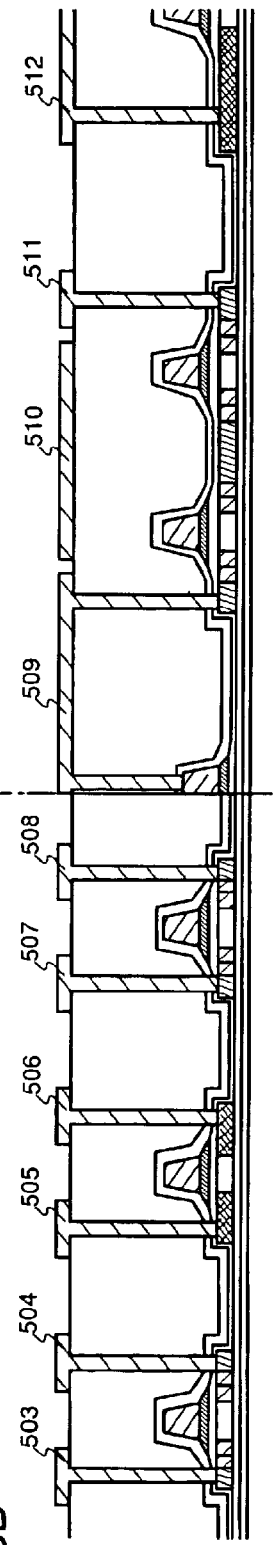
Figure 6C:
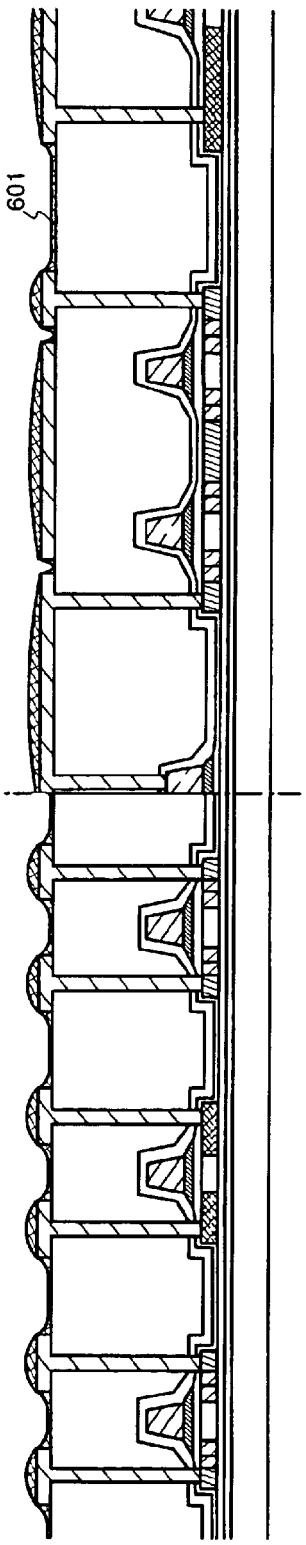

Next, as shown in FIG. 6C, in order to prevent the step difference defect of pixel electrodes due to the shape defect of contact step difference, an organic resin film 601 is formed as shown in FIG. 6C. Polyimide, acrylic resin, polyamide, polyimideamide, BCB and the like can be used for the organic resin film 601. The same material as that for the second interlayer insulating film 502 can be used for the organic resin film 601. In this case, the material with a concentration and a viscosity lower than those of the second interlayer insulating film 502 is used for the organic resin film 601. Typically, acrylic resin with a concentration of 3 to 20%, preferably 5 to 10% of that of the second interlayer insulating film may be used. In the present embodiment, acrylic resin with a concentration of 10% of that of the second interlayer insulating film 502 is used.

The organic resin film 601 is formed by dropping an organic resin onto the substrate and applying thereto with a spin coater at a rotation number of 100 rpm to 2000 rpm (preferably 1000 rpm to 1500 rpm). In the present embodiment, 5 cc of acrylic resin with a dilution of 10 times that of the concentration of acrylic resin used for the second interlayer insulating film is dropped onto the substrate and applied thereto at a rotation number of a spin coater of 1400 rpm. The rotation number may not be constant at all time. Organic resin can also be applied at a low rotation number (100 rpm to 500 rpm) and then at a high rotation number (1000 rpm to 1500 rpm).

Next, the applied organic resin film 601 is baked by heat treatment at 250° C. for one hour.

Figure 7A:
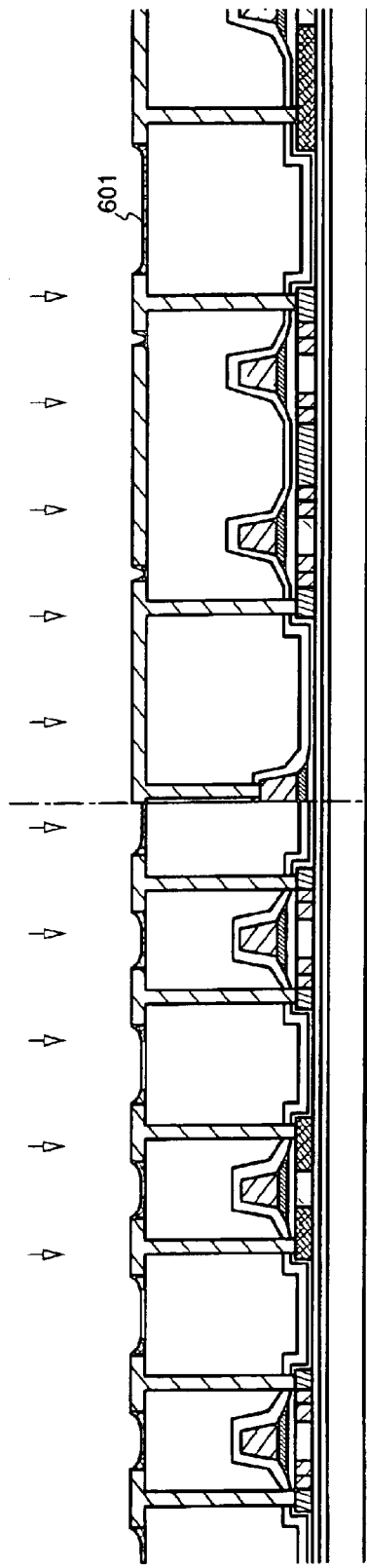
FIGS. 7A to 7B show processes of manufacturing the semiconductor display device.

Next, as shown in FIG. 7A, etching is conducted so as to remove the organic resin present on the wirings. In the present embodiment, ICP etching is conducted, in which etching gas is mixed, and an RF power of 450 W is supplied to a coil-type electrode under a pressure of 1.2 Pa, whereby plasma is generated. An RF power of 100 W is also supplied to the substrate (sample stage) side, and a substantially negative self-bias voltage is applied. By appropriately selecting etching gas, the organic resin on the wirings is etched and removed.

In the present embodiment, ICP etching is used for the purpose of removing the organic resin on the wirings. The organic resin on the wirings can also be removed by ashing. For example, etching is conducted by supplying an RF power of 100 W to electrodes under a pressure of 67 Pa to generate plasma. As etching gas, $O_2$ is mainly used.

Figure 7B:
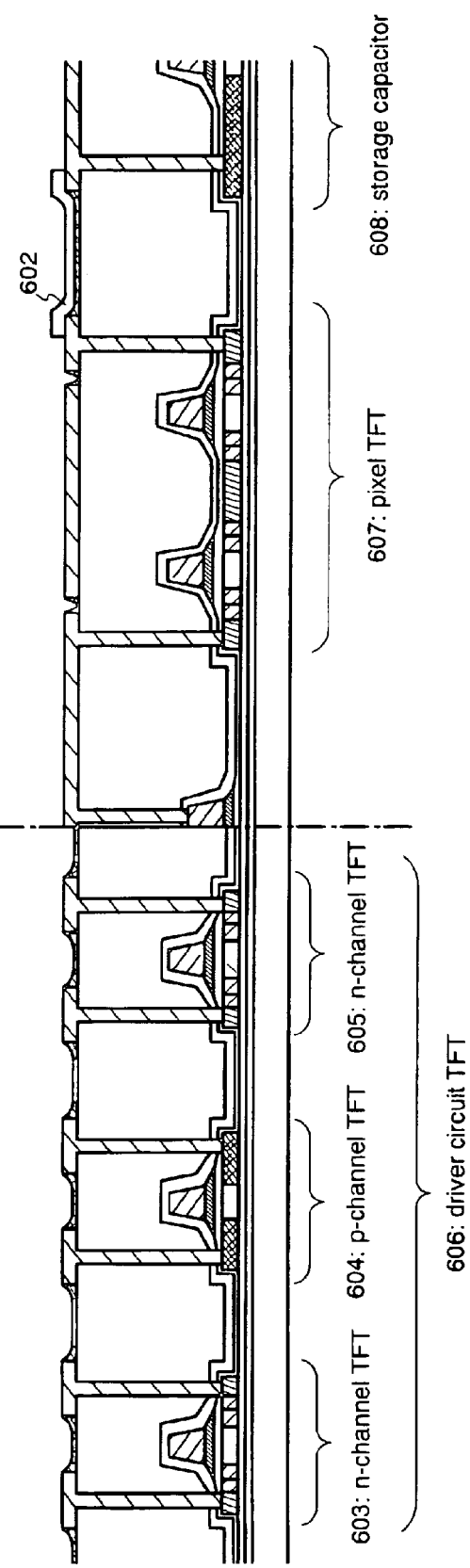
Figure 8:
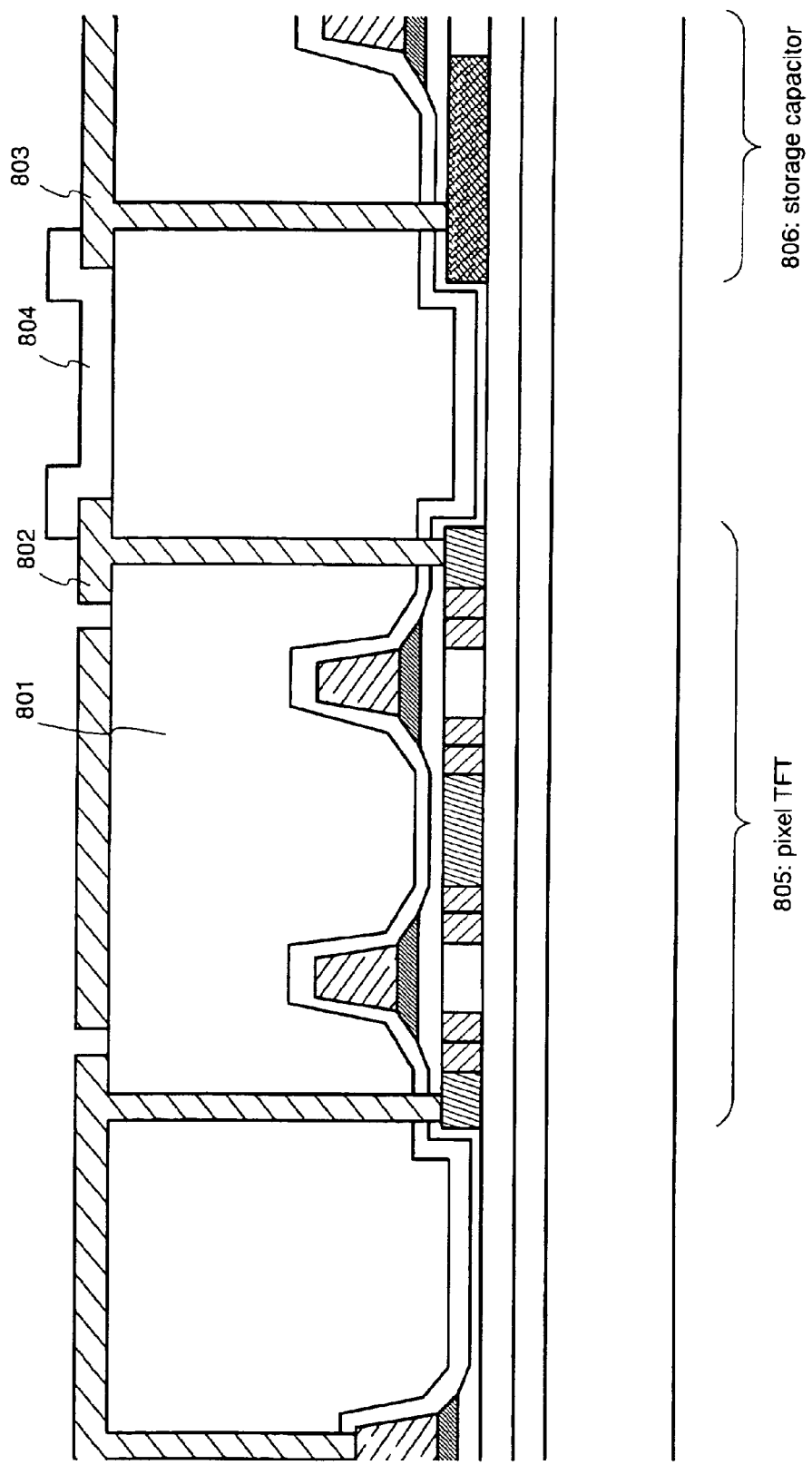
FIG. 8 is a cross-sectional view of a conventional semiconductor device.

Next, as shown in FIG. 7B, sixth photolithography is conducted, whereby a transparent pixel electrode 602 is formed on the organic resin film 601 for preventing the step difference defect of pixel electrodes due to the shape defect of contact step difference. The transparent pixel electrode 602 can be formed of indium oxide ($In_2O_3$), an indium oxide-tin oxide ($In_2O_3$—$SnO_2$: ITO) alloy, or the like by sputtering, vacuum vapor deposition, and the like. Such a material is etched with a solution of a hydrochloric acid type. However, a residue is likely to be generated particularly by etching of ITO. Therefore, in order to improve processability of etching, indium oxide—zinc oxide $In_2O_3$—ZnO alloy may be used. Zinc oxide (ZnO) is also a suitable material. Furthermore, zinc oxide with gallium (Ga) added thereto (ZnO: Ga) or the like can be used so as to enhance transmittance of visible light and conductivity.

As described above, in 6 photography processes, a driving circuit portion having n-channel TFTs, p-channel TFTs, and n-channel TFTs and a pixel portion having pixel TFTs and storage capacitors can be manufactured on the same substrate. As a result, the processes can be shortened, which can contribute to the reduction in manufacturing cost and the enhancement of yield.

[Embodiment 2]

The present invention can also be carried out in a display device (hereinafter, referred to as a light-emitting device) using a light-emitting material that allows EL (electroluminescence) to be obtained. Hereinafter, a detailed method of manufacturing a light-emitting device adopting the present invention will be described with reference to FIGS. 11A and 11B. The processes prior to forming the second interlayer insulating film are the same as those in Embodiment 1. Therefore, the description thereof will be omitted here.

First, contact holes are formed in the first interlayer insulating film and the second interlayer insulating film by photolithography. The contact holes are opened by dry etching. The second interlayer insulating film is etched, and thereafter, the first interlayer insulating film is etched.

Then, wirings are formed by photolithography. In a driving circuit portion, source wirings for forming contact with source regions of the semiconductor layers and drain wirings for forming contact with the drain regions are formed. In a pixel portion, source wirings and drain wirings are formed. In the present embodiment, Ti/Al/Ti is used for metal wiring.

Next, in order to flatten the surface of the second interlayer insulating film roughened by etching of wiring and the like, an organic resin film 1201 is applied to the surface of the second interlayer insulating film. The same material as that for the second interlayer insulating film can be used as the material for the organic resin film 1201. More specifically, polyimide, acrylic resin, polyamide, polyimideamide, BCB, or the like can be used. Furthermore, the material with a concentration and a viscosity lower than those of the second interlayer insulating film is used for the organic resin film 1201. Preferably, acrylic resin with a concentration of 3 to 20%, preferably 5 to 10% of that of the second interlayer insulating film may be used. In the present embodiment, acrylic resin with a concentration of 10% of that of the second interlayer insulating film is used.

The organic resin film 1201 is formed by dropping an organic resin onto the substrate and applying thereto with a spin coater at a rotation number of 100 rpm to 2000 rpm (preferably 500 rpm to 1000 rpm). In the present embodiment, 5 cc of acrylic resin with a dilution of 10 times that of the concentration of acrylic resin used for the second interlayer insulating film is dropped onto the substrate and applied thereto at a rotation number of a spin coater of 1400 rpm. The rotation number may not be constant at all times.

Organic resin can also be applied at a low rotation number (100 rpm to 500 rpm) and then at a high rotation number (1000 rpm to 1500 rpm).

Next, the applied organic resin film 1201 is baked by heat treatment at 250° C. for one hour.

Next, etching is conducted so as to remove the organic resin present on the wirings. In the present embodiment, ICP etching is conducted, in which etching gas is mixed, and an RF power of 450 W is supplied to a coil-type electrode under a pressure of 1.2 Pa, whereby plasma is generated. An RF power of 100 W is also supplied to the substrate (sample stage) side, and a substantially negative self-bias voltage is applied. By appropriately selecting etching gas, the organic resin on the wirings is etched and removed.

In the present embodiment, ICP etching is used for the purpose of removing the organic resin on the wirings. The organic resin on the wirings can also be removed by ashing. For example, etching is conducted by supplying an RF power of 100 W to electrodes under a pressure of 67 Pa to generate plasma. As etching gas, $O_2$ is mainly used.

Next, a transparent pixel electrode 1202 is formed on the organic resin film 1201 for flattening the roughness of the surface of the second interlayer insulating film. The transparent pixel electrode 1202 can be formed of indium oxide ($In_2O_3$), an indium oxide-tin oxide ($In_2O_3$—$SnO_2$: ITO) alloy, or the like by sputtering, vacuum vapor deposition, and the like. Such a material is etched with a solution of a hydrochloric acid type. However, a residue is likely to be generated particularly by etching of ITO. Therefore, in order to improve processability of etching, indium oxide—zinc oxide ($In_2O_3$—ZnO) alloy may be used. Zinc oxide (ZnO) is also a suitable material. Furthermore, zinc oxide with gallium (Ga) added thereto (ZnO: Ga) or the like can be used so as to enhance transmittance of visible light and conductivity.

Then, a bank 1203 is formed as shown in FIG. 11B. The bank 1203 can be formed by patterning an insulating film or an organic resin film containing silicon with a thickness of 100 to 400 nm. The bank 1203 is formed so as to fill a region between pixels (pixel electrodes). The bank 1203 is formed also for the purpose of preventing an organic EL material of a light-emitting layer and the like to be formed from coming into contact with the ends of the pixel electrodes.

As the material for the bank 1203, photosensitive polyimide, photosensitive acrylic resin, non-photosensitive acrylic resin, or the like can be used.

The bank 1203 is formed of an insulating film, so that care should be taken so as not to cause electrostatic breakdown of a device during film formation. In the present embodiment, carbon particles and pigment are added to the insulating film to be a material for the bank so as to decrease a resistance, whereby static electricity can be suppressed. In this case, the added amount of carbon particles and pigment should be adjusted so as to obtain a resistance value of $1\times10^6$ to $1\times10^{12}$ Ωm (preferably 1×108 to $1\times10^{10}$ Ωm).

Next, the surface of the bank is subjected to pre-treatment. In the present embodiment, the entire substrate is heated to 100° C. to 120° C. and irradiated with UV-light while oxygen plasma is being formed. Because of this, ozone plasma treatment is conducted with respect to the surface of a positive electrode. Because of the pre-treatment, adsorbed oxygen and adsorbed water is removed on the surface of the positive electrode, whereby a work function of the surface is enhanced. Furthermore, the flatness of the surface of the positive electrode is enhanced. The flatness of the surface of the positive electrode should be set so that an average square roughness (RmS) is 5 nm or less (preferably 3 nm or less).

Instead of ozone plasma treatment, plasma treatment using rare gas such as argon, neon, or helium may be conducted.

Next, an EL layer 1204 is formed by spin coating. In the present embodiment, a lamination of a hole-injection layer and a light-emitting layer is referred to as an EL layer. More specifically, a lamination obtained by combining a light-emitting layer with a hole-injection layer, a hole-transport layer, a hole-blocking layer, an electron-transport layer, an electron-injection layer, or an electron-blocking layer is referred to as an EL layer. The El layer may be formed of an organic material or an inorganic material. Furthermore, the EL layer may be formed of a polymer material or a low-molecular material.

In the present embodiment, first, polythiophene (PEDOT) is formed to a thickness of 20 nm as a hole-injection layer, and polyvinylcarbazole (PVK) is formed to a thickness of 80 nm as a light-emitting layer emitting white light. Polythiophene is applied by being dissolved in water. Polyvinylcarbazole may be applied by being dissolved in 1,2-dichloromethane. Furthermore, the hole-injection layer and the light-emitting layer are heat-treated in a temperature range (typically 80° C. to 120° C.) that does not break down the EL layer to volatilize a solvent, whereby a thin film is obtained.

For example, PVK, Bu-PBD(2-(4'-tert-butylphenyl)-5-(4"-biphenyl)-1,3,4-oxadiazole), coumarin6, DCM1 (4-dicyanomethylene-2-methyl-6-p-dimethylaminostyryl-4H-pyran), TPB(tetraphenylbutadiene) and Nile Red dissolved in 1,2-dichloromethane can be used.

Furthermore, as the polymer material used for the light-emitting layer emitting white light, those which are described in Japanese Patent Application Laid-Open No. 08-96959 or 09-63770 can also be used.

After the EL layer is formed, a cathode 1205 made of a conductive film with a small work function is formed to a thickness of 400 nm. In the present embodiment, the cathode 1205 is obtained by forming aluminum and lithium into an alloy by codeposition. Thus, an EL element including the pixel electrode (positive electrode) 1202, the EL layer 1204, and the cathode 1205 is formed.

Next, a passivation film 1206 is formed so as to cover the EL element completely after the cathode 1205 is formed. At this time, it is preferable to use a film with good step coverage as the passivation film. It is effective to use a carbon film, in particular, a DLC (diamond like carbon) film. The DLC film can be formed in a range of room temperature to 100° C. Therefore, the DLC film can be formed easily above the EL layer with low heat resistance. Furthermore, the DLC film can suppress oxidation of the EL layer and the cathode due to its high blocking effect with respect to oxygen.

Furthermore, a sealing member 1207 is provided on the passivation film and a cover member 1208 is attached thereto. As the sealing member 1207, a UV-curable resin may be used, and a material having a moisture-absorbing effect or an antioxidant effect can be provided in the sealing member 1207.

As the cover member 1208, a glass substrate, a metal substrate, a ceramics substrate, or a plastic substrate (including a plastic film) can be used. It is effective to provide a carbon film (in particular, DLC film) on both sides or one side of the cover member 1208. In the case of using a plastic film as the cover member 1208, the DLC film can be formed on both sides thereof by roll-to-roll method.

Thus, the state shown in FIG. 11B is obtained. It is effective to conduct the processes from formation of the bank 1203 to formation of the passivation film 1206 continuously without being exposed to the atmosphere by using a film-formation apparatus of a multi-chamber system (or an in-line system). When the EL layer 1204 is formed by spin coating, it is conducted in a nitrogen atmosphere or a rare gas atmosphere subjected to deoxidation.

As described above, by applying the organic resin film 1201 on the second interlayer insulating film, the surface of the second interlayer insulating film can be flattened. Because of this, the flatness of the pixel electrode 1202 formed on the second interlayer insulating film is enhanced, and a minute defect in the light-emitting device can be suppressed, which contributes to the enhancement of yield.

[Embodiment 3]

An active matrix substrate, and a liquid crystal display device fabricated by carrying out the present invention can be used for various electro-optical devices. Further, the present invention can be applied to all electronic equipments incorporating such electro-optical devices as display media.

As the electronic instrument, a video camera, a digital camera, a projector (rear or front type), a head mount display (goggle type display), a navigation system, a personal computer, a portable information terminal (mobile computer, cellular telephone, electronic book, etc.), and the like can be enumerated. Examples of these are shown in FIGS. 13 and 14.

FIG. 13A shows a personal computer which is comprised by a main body 1401, an image input portion 1402, a display portion 1403, and a keyboard 1404. The present invention can be applied to the image input portion 1402, the display portion 1403 and other driving circuits.

FIG. 13B shows a video camera which is comprised by a main body 1405, a display portion 1406, an audio input portion 1407, an operation switch 1408, a battery 1409, and an image receiving portion 1410. The present invention can be applied to the display portion 1406, the audio input portion, and other driving circuits.

FIG. 13C shows a mobile computer which is comprised by a main body 1411, a camera portion 1412, an image receiving portion 1413, an operation switch 1414, and a display portion 1415. The present invention can be applied to the display portion 1415 and the other driving circuits.

FIG. 13D shows a goggle type display which is comprised by a main body 1416, a display portion 1417, and an arm portion 1418. The present invention can be applied to the display portion 1417 and other driving circuits.

FIG. 13E shows a player using a recording medium records a program (hereinafter referred to as a "recording medium"), which is comprised by a main body 1419, a display portion 1420, a speaker portion 1421, a recording medium 1422, and an operation switch 1423. This device uses a DVD (Digital Versatile Disc), CD, or the like for the recording medium, and can perform music appreciation, film appreciation, games and the use for Internet. The present invention can be applied to the display portion 1420 and the other driving circuits.

FIG. 13F shows a digital camera which is comprised by a main body 1424, a display portion 1425, a viewfinder 1426, an operation switch 1427, and an image receiving portion (not shown). The present invention can be applied to the display portion 1425 and the other driving circuits.

Figures 14A, 14B:
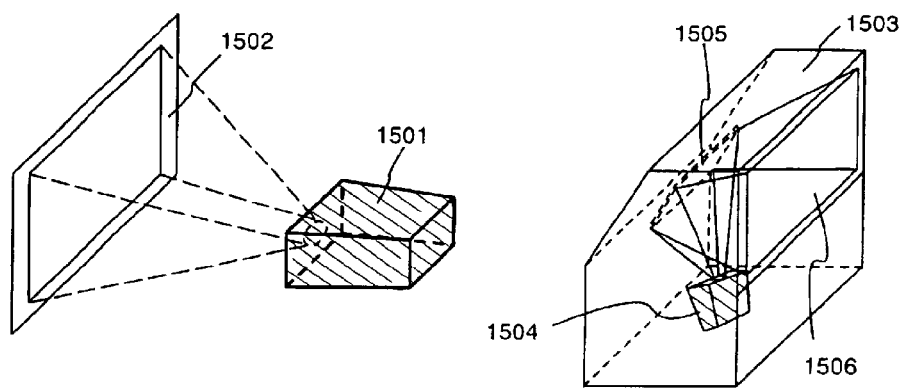
FIGS. 14A and 14B illustrate examples of devices utilizing the semiconductor display device.

FIG. 14A shows a front type projector which is comprised by an optical source system and a display device, and a screen 1502. The present invention can be applied to the display device and the other driving circuits.

FIG. 14B shows a rear type projector which is comprised by a main body 1503, an optical source system and display device, a mirror 1505, and a screen 1506. The present invention can be applied to the display device and the other driving circuits.

As described above, the applicable range of the present invention is extremely wide, and the invention can be applied to electronic equipments in all fields. Note that the electronic equipments of the present embodiment can be achieved by utilizing any combination of composition in Embodiments 1 to 3.

According to the present invention, TFTs are produced by using 6 photomasks, and a resin film is formed at the ends of metal wiring, whereby pixel electrodes can be prevented from being disconnected due to a change in shape of an interlayer insulating film at the ends of the metal wiring. Furthermore, an alignment defect of liquid crystal molecules and a non-uniform electric field, caused by the roughness of the surface of the interlayer insulating film, can be prevented. Furthermore, a defect of a light-emitting device, in which a minute defect of a light-emitting layer occurs due to the roughness of the surface of the pixel electrode, can be prevented. Thus, the productivity and yield of the semiconductor device and the light-emitting device can be enhanced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method of manufacturing a semiconductor device, comprising:

forming a thin film transistor over a substrate;

forming a first insulating film covering the thin film transistor;

forming a contact hole by etching the first insulating film;

forming a metal wiring on the first insulating film, wherein the metal wiring is electrically connected to the thin film transistor;

forming a second insulating film on the first insulating film and the metal wiring;

etching the second insulating film on the metal wiring to expose a surface of the metal wiring wherein the second insulating film has a curved surface at a sidewall portion of the metal wiring; and forming a pixel electrode on the second insulating film, wherein the pixel electrode is in contact with the metal wiring.

2. A method of manufacturing a semiconductor device according to claim 1, wherein the second insulating film is formed by coating and the coating is performed by rotating the substrate at a rotation number of 100 to 2000 rpm.

3. A method of manufacturing a semiconductor device according to claim 1, wherein the semiconductor device is at least one selected from the group consisting of a personal computer, a video camera, a mobile computer, a goggle-type display, a player using a recording medium, digital camera, and a projector.

4. A method of manufacturing a semiconductor device according to claim 1, wherein the second insulating film comprises one or a plurality of kinds of materials selected from the group consisting of polyimide, acrylic resin, polyamide, polyimideamide, and benzocylobutene.

5. A method of manufacturing a semiconductor device, comprising:

forming a thin film transistor and a capacitor element over a substrate;

forming an insulating film covering the thin film transistor and the capacitor element;

forming a contact hole by etching the insulating film;

forming a first metal wiring and a second metal wiring on the insulating film, wherein the first metal wiring and the second metal wiring are electrically connected to the thin film transistor and the capacitor element, respectively;

forming a second insulating film on the first insulating film, on the first metal wiring and on the second metal wiring;

etching the second insulating film on the first metal wiring and the second metal wiring to expose a surface of the first metal wiring and the second metal wiring; and forming a pixel electrode on the second insulating film, wherein the pixel electrode is in contact with the first metal wiring and the second metal wiring.

6. A method of manufacturing a semiconductor device according to claim 5, wherein the second insulating film is formed by coating and the coating is performed by rotating the substrate at a rotation number of 100 to 2000 rpm.

7. A method of manufacturing a semiconductor device according to claim 5, wherein the semiconductor device is at least one selected from the group consisting of a personal computer, a video camera, a mobile computer, a goggle-type display, a player using a recording medium, digital camera, and a projector.

8. A method of manufacturing a semiconductor device according to claim 5, wherein the second insulating film comprises one or a plurality of kinds of materials selected from the group consisting of polyimide, acrylic resin, polyamide, polyimideamide, and benzocylobutene.

9. A method of manufacturing a light emitting device, comprising:

forming a thin film transistor and a capacitor element over a substrate;

forming an insulating film covering the thin film transistor and the capacitor element;

forming a contact hole by etching the insulating film;

forming a first metal wiring and a second metal wiring on the insulating film, wherein the first metal wiring and the second metal wiring are electrically connected to the thin film transistor and the capacitor element, respectively;

forming a second insulating film on the first insulating film, on the first metal wiring and on the second metal wiring;

etching the second insulating film on the first metal wiring and the second metal wiring to expose a surface of the first metal wiring and the second metal wiring; and forming a pixel electrode on the second insulating film, wherein the pixel electrode is in contact with the first metal wiring and the second metal wiring.

10. A method of manufacturing a light emitting device according to claim 9, wherein the second insulating film is formed by coating and the coating is performed by rotating the substrate at a rotation number of 100 to 2000 rpm.

11. A method of manufacturing a light emitting device according to claim 9, wherein the light emitting device is incorporated in at least one selected from the group consisting of a personal computer, a video camera, a mobile computer, a goggle-type display, a player using a recording medium, digital camera, and a projector.

12. A method of manufacturing a light emitting device according to claim 9, wherein the second insulating film comprises one or a plurality of kinds of materials selected from the group consisting of polyimide, acrylic resin, polyamide, polyimideamide, and benzocylobutene.

13. A method of manufacturing a semiconductor device, comprising:

forming a thin film transistor over a substrate;

forming a first insulating film covering the thin film transistor;

forming a contact hole by etching the first insulating film;

forming a metal wiring on the first insulating film, wherein the metal wiring is electrically connected to the thin film transistor;

forming a second insulating film on the first insulating film and the metal wiring, wherein the second insulating film has a lower viscosity than the first insulating film;

etching the second insulating film on the metal wiring to expose a surface of the metal wiring; and forming a pixel electrode on the second insulating film, wherein the pixel electrode is in contact with the metal wiring.

14. A method of manufacturing a semiconductor device according to claim 13, wherein the second insulating film is formed by coating and the coating is performed by rotating the substrate at a rotation number of 100 to 2000 rpm.

15. A method of manufacturing a semiconductor device according to claim 13, wherein the second insulating film comprises one or a plurality of kinds of materials selected from the group consisting of polyimide, acrylic resin, polyamide, polyimideamide, and benzocylobutene.

16. A method of manufacturing a semiconductor device according to claim 13, wherein the semiconductor device is at least one selected from the group consisting of a personal computer, a video camera, a mobile computer, a goggle-type display, a player using a recording medium, digital camera, and a projector.

17. A method of manufacturing a light emitting device, comprising:

forming a thin film transistor over a substrate;

forming a first insulating film covering the thin film transistor;

forming a contact hole by etching the first insulating film;

forming a metal wiring on the first insulating film, wherein the metal wiring is electrically connected to the thin film transistor;

forming a second insulating film on the first insulating film and the metal wiring, wherein the second insulating film has a lower viscosity than the first insulating film;

etching the second insulating film on the metal wiring to expose a surface of the metal wiring; and forming a pixel electrode on the second insulating film, wherein the pixel electrode is in contact with the metal wiring.

18. A method of manufacturing a light emitting device according to claim 17, wherein the second insulating film is formed by coating and the coating is performed by rotating the substrate at a rotation number of 100 to 2000 rpm.

19. A method of manufacturing a light emitting device according to claim 17, wherein the second insulating film comprises one or a plurality of kinds of materials selected from the group consisting of polyimide, acrylic resin, polyamide, polyimideamide, and benzocylobutene.

20. A method of manufacturing a light emitting device according to claim 17, wherein the light emitting device is incorporated in at least one selected from the group consisting of a personal computer, a video camera, a mobile computer, a goggle-type display, a player using a recording medium, digital camera, and a projector.

21. A method of manufacturing a semiconductor device, comprising:

forming a thin film transistor over a substrate;

forming a first insulating film covering the thin film transistor;

forming a contact hole by etching the first insulating film;

forming a metal wiring on the first insulating film, wherein the metal wiring is electrically connected to the thin film transistor;

forming a second insulating film on the first insulating film and the metal wiring;

etching the second insulating film on the metal wiring to expose a surface of the metal wiring wherein the second insulating film has at least a portion that is thinner than a film thickness of the metal wiring; and forming a pixel electrode on the second insulating film, wherein the pixel electrode is in contact with the metal wiring.

22. A method of manufacturing a semiconductor device according to claim 21, wherein the second insulating film is formed by coating and the coating is performed by rotating the substrate at a rotation number of 100 to 2000 rpm.

23. A method of manufacturing a light emitting device according to claim 21, wherein the second insulating film comprises one or a plurality of kinds of materials selected from the group consisting of polyimide, acrylic resin, polyamide, polyimideamide, and benzocylobutene.

24. A method of manufacturing a semiconductor device according to claim 21, wherein the semiconductor device is at least one selected from the group consisting of a personal computer, a video camera, a mobile computer, a goggle-type display, a player using a recording medium, digital camera, and a projector.

* * * * *